United States Patent [19]

Fotowat-Ahmady et al.

[11] Patent Number: 5,338,985

[45] Date of Patent: Aug. 16, 1994

[54] LOW VOLTAGE, SIMPLIFIED AND TEMPERATURE COMPENSATED LOGARITHMIC DETECTOR

[75] Inventors: Ali Fotowat-Ahmady, Sunnyvale; Nasrollah S. Navid, Saratoga, both of Calif.

[73] Assignee: North American Philips Corporation, New York, N.Y.

[21] Appl. No.: 54,472

[22] Filed: Apr. 28, 1993

Related U.S. Application Data

[63] Continuation of Ser. No. 709,245, Jun. 3, 1991.

[51] Int. Cl.$^5$ .................. H03G 3/00; G06G 7/12
[52] U.S. Cl. ..................... 307/494; 307/490; 307/491; 328/145
[58] Field of Search ........... 307/490, 492, 529, 268, 307/494; 328/142, 143, 145, 14; 330/124 R, 295

[56] References Cited

U.S. PATENT DOCUMENTS

| | | | |
|---|---|---|---|
| 3,605,027 | 9/1971 | Nichols | 307/492 |
| 3,992,622 | 11/1976 | Numata et al. | 328/145 |
| 4,593,268 | 6/1986 | Blauschild | |
| 4,604,532 | 8/1986 | Gilbert | 307/492 |
| 4,972,512 | 11/1990 | Garskamp | 307/490 |
| 4,990,803 | 2/1991 | Gilbert | 328/145 |

FOREIGN PATENT DOCUMENTS 248428  4/1987  European Pat. Off. .

OTHER PUBLICATIONS

"An Eight-Stage Log Amplifier", by D. Tran-Nguyen, RF Design Feature, Nov., 1986, pp. 84–89.
"Totally-Implantable Multichannel Biomedical Dimension Telemetry: Signal Generation and Detection Integrated Circuits and Telemetry Receivers", by K. K. Abadi, Integrated Circuits Laboratory, May, 1989, pp. 57–71.
"Monolithic Design Shrinks Logamp Architecture", by M. Parkyn, Microwaves & RF, Sep., 1990, pp. 179–183.
Signetics IC NE605 (FM IF/demodulator).

*Primary Examiner*—Curtis Kuntz
*Assistant Examiner*—Sinh Tran
*Attorney, Agent, or Firm*—Laurie E. Gathman

[57] ABSTRACT

An electronic circuit with a logarithmic detector performs the following operations: receiving an input voltage, generating a series of subsequently amplified versions of the input voltage, rectifying the versions, thereupon rescaling and converting the versions into currents, summing the currents and applying the summed current to a resistor. With regard to the prior art the order of rectification and rescaling has been interchanged. As a result, the design is simplified, the circuit's supply voltage is lower than that of the prior art, and the circuit is more accurate and easier to compensate for temperature dependence.

17 Claims, 4 Drawing Sheets

LOW VOLTAGE, SIMPLIFIED AND TEMPERATURE COMPENSATED LOGARITHMIC DETECTOR

This is a continuation of application Ser. No. 07/709,245, filed Jun. 3, 1991.

FIELD OF THE INVENTION

The invention relates to an electronic circuit with a logarithmic detector.

BACKGROUND ART

A logarithmic detector provides an output signal that represents the logarithm of an input signal. Such a circuit is used in technical areas where it is important to process wide dynamic input ranges, for instance, in cellular radios, spectrum analyzers, cordless telephones and radar equipment. The logarithmic detector typically functions as a received signal strength indicator (RSSI). In cellular radio, this function is necessary for continuously monitoring the received signal strength by the radio's microcontroller. The RSSI function requires a dc output voltage which is proportional to the logarithm of the input signal level.

Basically, such a detector comprises a cascade of signal amplifiers. For the sake of clearness it is assumed below that the amplifiers have identical linear-amplification ranges and identical amplification "A". The first amplifier of the cascade receives an input signal "v" that is successively amplified by the subsequent amplifiers in the cascade. The repetitive amplification continues until a particular amplifier runs out of its linear range and into its limiting range. In its limiting range, each amplifier furnishes a clipped version of its amplified input signal. The n-th amplifier along the cascade runs into its limiting range when its output signal $A^n v$ exceeds the limit of the linear amplification range. Consequently, the input signal values at which the respective amplifiers leave their linear amplification ranges are proportional to $A^{-n}$. Summing the output signals of all amplifiers approximates a linear function of the logarithm of the input signal.

In practice, the amplifiers are signal voltage amplifiers. The signals supplied by the cascade have to be rectified in order to generate a dc output quantity representative of the signal's strength. Generally, an interstage filter is inserted into the cascade for reducing noise. Such a filter, however, causes undesired losses in amplitude. The output voltages therefore usually are rescaled for loss-compensation before being processed further.

In prior art circuit NE605 manufactured by Signetics Co., a part of Philips, the output voltages of the amplifiers are routed to a rectifying element via a resistor ladder that comprises stacked pairs of resistors. The amplifiers have complementary outputs connected to nodes between particular pairs of resistors. The voltage division attained in this way takes care of the rescaling of the signal. The rescaling, however, also affects the various dc levels of the voltages at the ladder nodes. These rescaled dc levels are to be removed from the rectifier output signal in a subsequent circuit.

The supply voltage required for operating the prior art circuit therefore is determined, among other things, by the resistor ladder. Further, removing the dc levels from the rectified signal requires additional circuitry. As a result, the detector has to be redesigned for each particular combination of rescaling resistors. Also, since various resistor values are used in a ladder, the accuracy of the resistors should be well controllable in order to avoid accumulation of signal distortion in the ladder and beyond.

OBJECTS OF THE INVENTION

It is an object of the invention to provide a logarithmic detector that is more easily manufacturable than the prior art detectors. It is a further object to furnish a logarithmic detector for operating at low supply voltages. It is another object to create a logarithmic detector that can be more simply compensated for temperature dependencies. It is still another object to supply an integrated circuit with a fully integrated detector.

SUMMARY OF THE INVENTION

To this end, the invention provides an electronic circuit with a logarithmic detector for receiving an input voltage, generating a series of subsequently amplified versions of the input voltage, rectifying the versions, thereupon rescaling and converting the versions into currents, summing the currents and applying the summed current to a resistor.

With regard to the prior art, the sequence of the rescaling and rectifying operations has been interchanged in the invention. This considerably simplifies the manufacturing. The subcircuits of the detector that generate the various versions of the input voltage are made identical, as are the stages that rectify the various versions. The rescaling and conversion portions can be made equal to a large degree. Thus, a modular architecture is obtained that can be expanded simply by adding modules, each with an amplifier, rectifier, and a rescaling and conversion unit. Since a resistor ladder with stacked pairs of resistors is avoided, the power supply required is independent of the number of modules and is lower than in the prior art, which is of particular importance for portable equipment. In addition, temperature compensation is accomplished in an effective and simple manner as a consequence of the modular structure.

BRIEF DESCRIPTION OF THE DRAWING

The various aspects of the invention are discussed below by way of example and with reference to the accompanying drawing wherein.

Throughout the figures, the same reference numerals indicate identical or corresponding features.

DETAILED DESCRIPTION OF THE EMBODIMENTS

SCHEMATIC EXAMPLE

Figure 1:
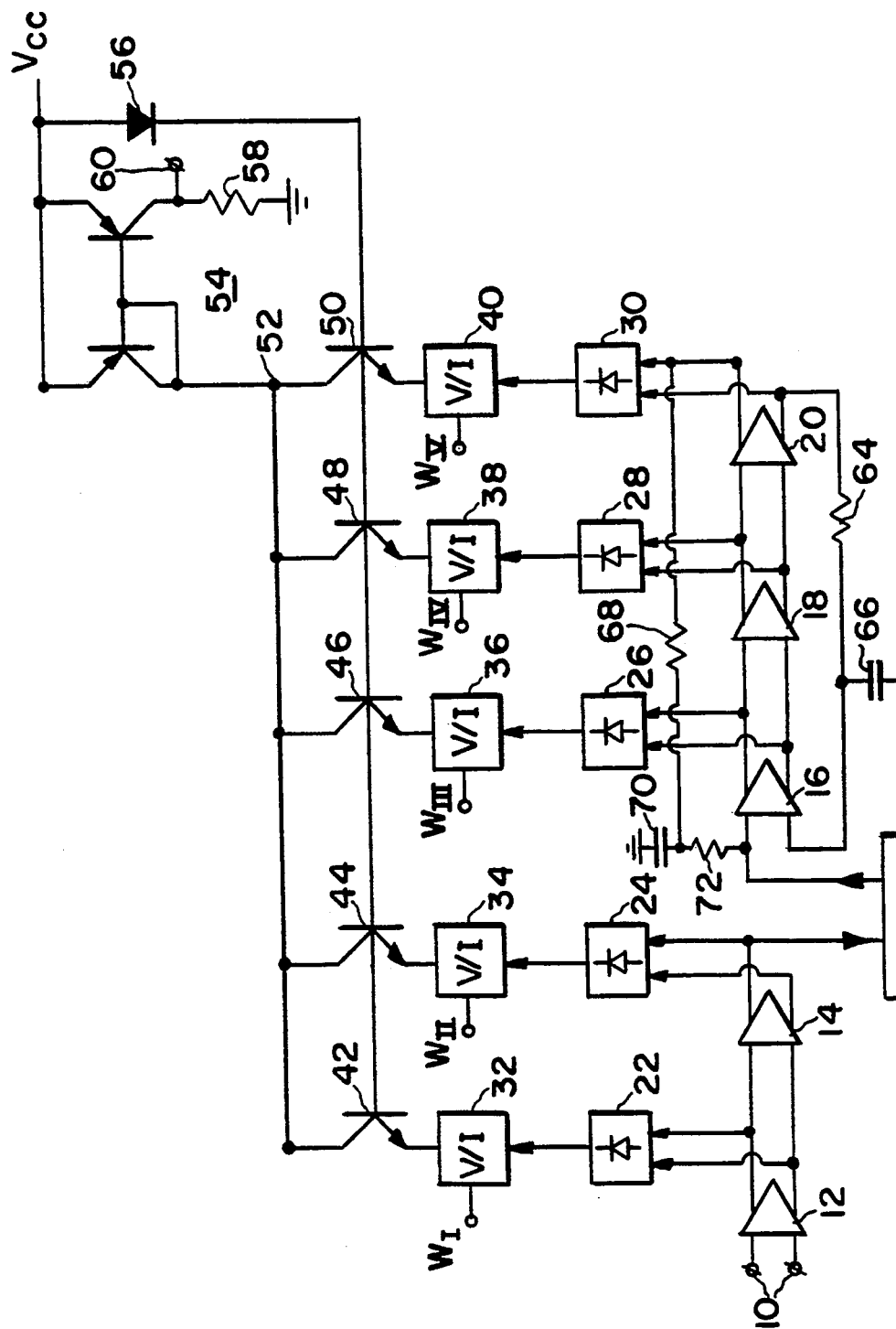
FIG. 1 is a schematic example of an electronic circuit according to the invention.

FIG. 1 is a schematic example of a circuit according to the invention. The circuit comprises a cascade of amplifiers 12, 14, 16, 18 and 20 that successively further amplify an input signal voltage at an input 10. Each of the amplifiers 12–20 provides an output signal to a corresponding rectifier 22, 24, 26, 28 or 30. Each rectifier 22–30 supplies at a rectifier output a signal voltage representative of a rectified version of the output voltage of the associated amplifier 12–20. All rectifiers 22–30 have their outputs respectively coupled to voltage-to-current converters 32, 34, 36, 38 and 40 that transform the rectified voltages into output currents. NPN transfer transistors 42, 44, 46, 48 and 50 each couple a respective output of converters 32–40 to an input 52 of a current mirror 54. Control electrodes of transfer transistors 42–50 are coupled to a source of a voltage supply $V_{cc}$ by means of a diode 56. An RSSI-resistor 58 is arranged between an output 60 of mirror 54 and ground.

An interstage filter 62 is inserted in the cascade 12–20 to reduce the propagation of noise. In order to compensate for the losses caused by filter 62, converters 32–40 rescale the signal before supplying output currents to transfer transistors 42–50. Labels $W_1$ to $W_y$ indicate the various rescaling operations being performed in the associated converters 32–40. A resistor 64 and a capacitor 66 form a first feed-back path, and a resistor 68, a capacitor 70 and a resistor 72 form a second feed-back path between the output of amplifier 20 and the input of amplifier 16. This negative feed-back establishes a general biasing of amplifiers 16–20 at the same biasing voltage. A similar negative feed-back structure (not shown) biases amplifiers 12–14.

Operation is as follows. If the signal's amplitude is small, amplifiers 12–20 remain in their linear amplification range. The output signal of each amplifier then follows the input signal at input 10. If the signal's amplitude increases, amplifier 20 is the first one to run out of its linear region since it receives the strongest signal. Amplifier 20 then provides at its output a clipped version of the amplified input signal. If the signal's amplitude keeps rising, amplifiers 12–20 successively run out of their linear range in reverse order, i.e., opposite to the direction of signal propagation.

As already is explained in the above background art section this operation is the base for a logarithmic detector. Note that the modular architecture considerably simplifies the design of such a circuit. Also note that the modular structure enables one to extend the number of cascaded stages without substantially changing the modules.

AMPLIFIERS AND RECTIFIERS

Figures 2A, 2B, 2C:
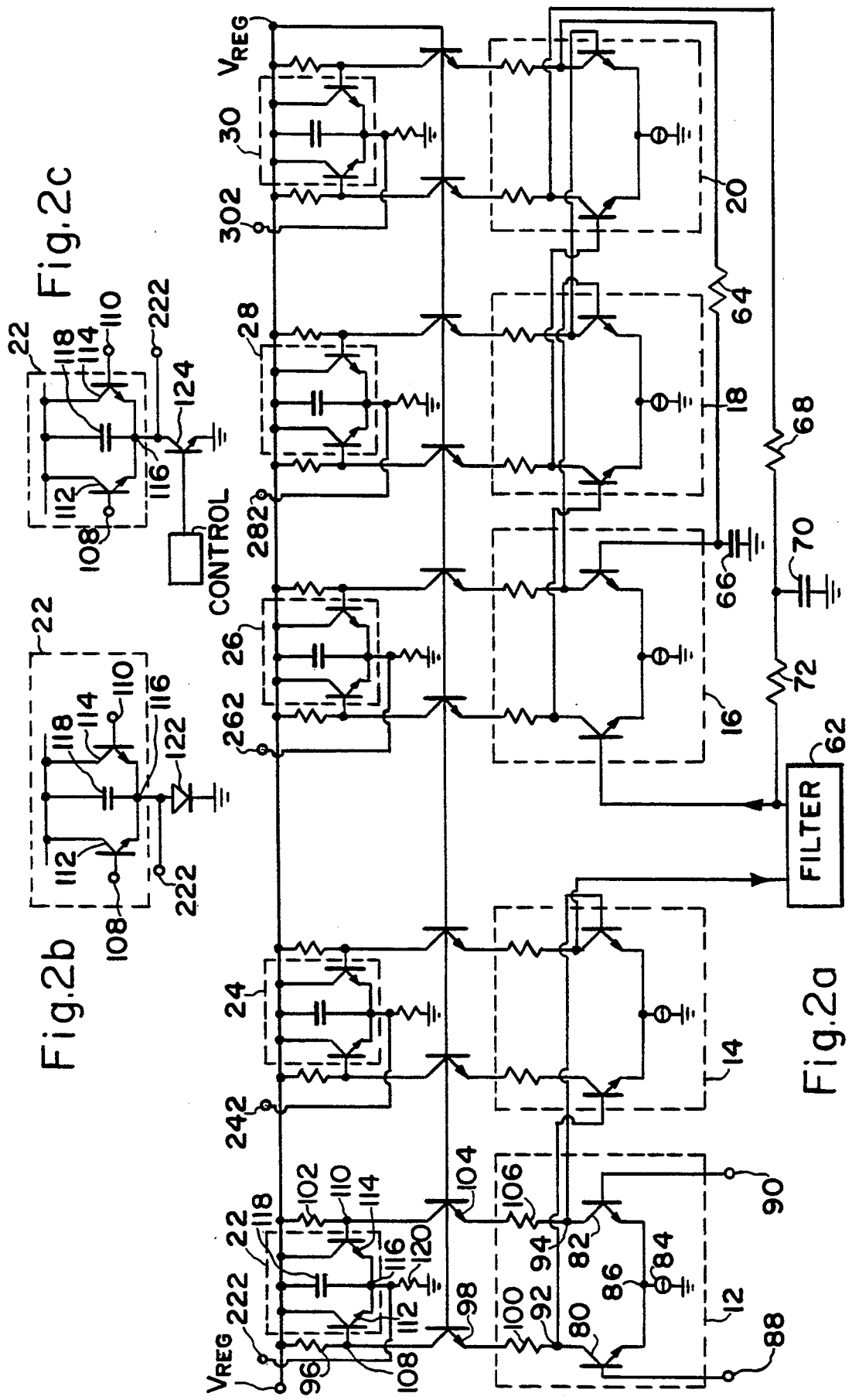
FIGS. 2a-c show the amplifier and rectifier circuits at the transistor level.

FIG. 2a shows the transistor details of amplifiers 12–20 and rectifiers 22–30 in FIG. 1. Since amplifiers 12–20 are mutually identical and rectifiers 22–30 are mutually identical, only amplifier 12 and rectifier 22 are described below.

Amplifier 12 includes NPN transistors 80 and 82 that have their main current paths connected to a current source 84 via a node 86. Amplifier inputs 88 and 90 are connected to the control electrodes of transistors 80 and 82. The main current paths of transistor 80 and 82 are also connected to amplifier outputs 92 and 94. A first resistor 96, a main current path of an NPN buffer transistor 98 and a second resistor 100 are arranged in series between a power supply $V_{REG}$ and output 92. Similarly, a first resistor 102, a main current path of an NPN buffer transistor 104 and a resistor 106 are arranged in series between power supply $V_{REG}$ and output 94. Control electrodes of buffer transistors 98 and 104 are connected to one another and preferably to the same power supply $V_{REG}$.

Outputs 92 and 94 are coupled to inputs of amplifier 14. A node 108 between resistor 96 and buffer transistor 98, and a node 110 between resistor 102 and buffer transistor 104 are connected to inputs of rectifier 22. Rectifier 22 has main current paths of NPN transistors 112 and 114 arranged in parallel between power supply $V_{REG}$ and a node 116. Transistors 112 and 114 have their control electrodes connected to nodes 108 and 110, respectively. A capacitor 118 is connected between power supply $V_{REG}$ and node 116. Node 116 forms an output of rectifier 22. A resistor 120 couples node 116 to ground.

$V_{REG}$ preferably is a regulated voltage source that, for instance, may be derived from $V_{cc}$. Regulated voltage source $V_{REG}$ disconnects amplifiers 12–20 and rectifiers 22–30 from the $V_{cc}$ supply. Since amplifiers 12–20 switch high currents at high speed, voltage swings are likely to occur at a supply line connected to amplifiers 12–20 owing to a supply line's internal impedance. The $V_{REG}$ supply line disconnects the high-current, high-speed switching part from other circuits, e.g., converters 32–40. Any possible voltage swings at the $V_{REG}$ supply line therefore cannot affect other circuitry through supply line interconnection.

Operation is as follows. A differential signal at nodes 88 and 90 generates associated currents through resistors 100 and 106. The resulting differential voltages at nodes 92 and 94 form the output signal that is supplied to subsequent amplifier 14. The currents pass through resistors 96 and 102 and control the current that charges capacitor 118 through transistors 112 and 114. Capacitor 118 accumulates charge supplied by transistors 112 and 114 that are turned on alternately. The voltage at node 116 therefore is indicative of a rectified version of the output voltages at nodes 92 and 94 and is supplied to converter 32 via a rectifier output 222.

Resistor 120 acts as a so-called bleeding device for discharging capacitor 118 at such a rate that, on one hand, intermittent signals at input 88/90 are distinguished from one another, but, on the other hand, the voltage at node 116 is not distorted substantially during reception of the signal at inputs 88 and 90. A diode 122 (FIG. 2b) or another current source, such as a transistor 124 (FIG. 2c) that is controllable by a control voltage for adapting the discharge rate of capacitor 118, can be used instead. Such a bleeding device increases the operational speed of the detector since it reduces the fall time at node 116.

Strictly speaking, such a bleeding device is not necessary if rectifier output 222 is discharged by the converter 32 to which it is connected. As will be discussed below, converter 32 comprises a bipolar transistor 130 (FIG. 3) whose base electrode is tied to rectifier output 222. The base current of transistor 130 may be sufficiently high for the bleeding process.

Buffer transistors 98 and 104 are preferably included in the detector circuit for uncoupling amplifier 12 from rectifier 22. This disengagement enables the designer to extend the range of resistor values used for resistors 96, 100, 102 and 106.

Typically, resistors 96 and 102 each are 22 K, resistors 100 and 106 each are 30 K, resistor 120 is 500 K and capacitor 118 is 3.5 pF.

CONVERTERS AND SUMMING PART

Figure 3:
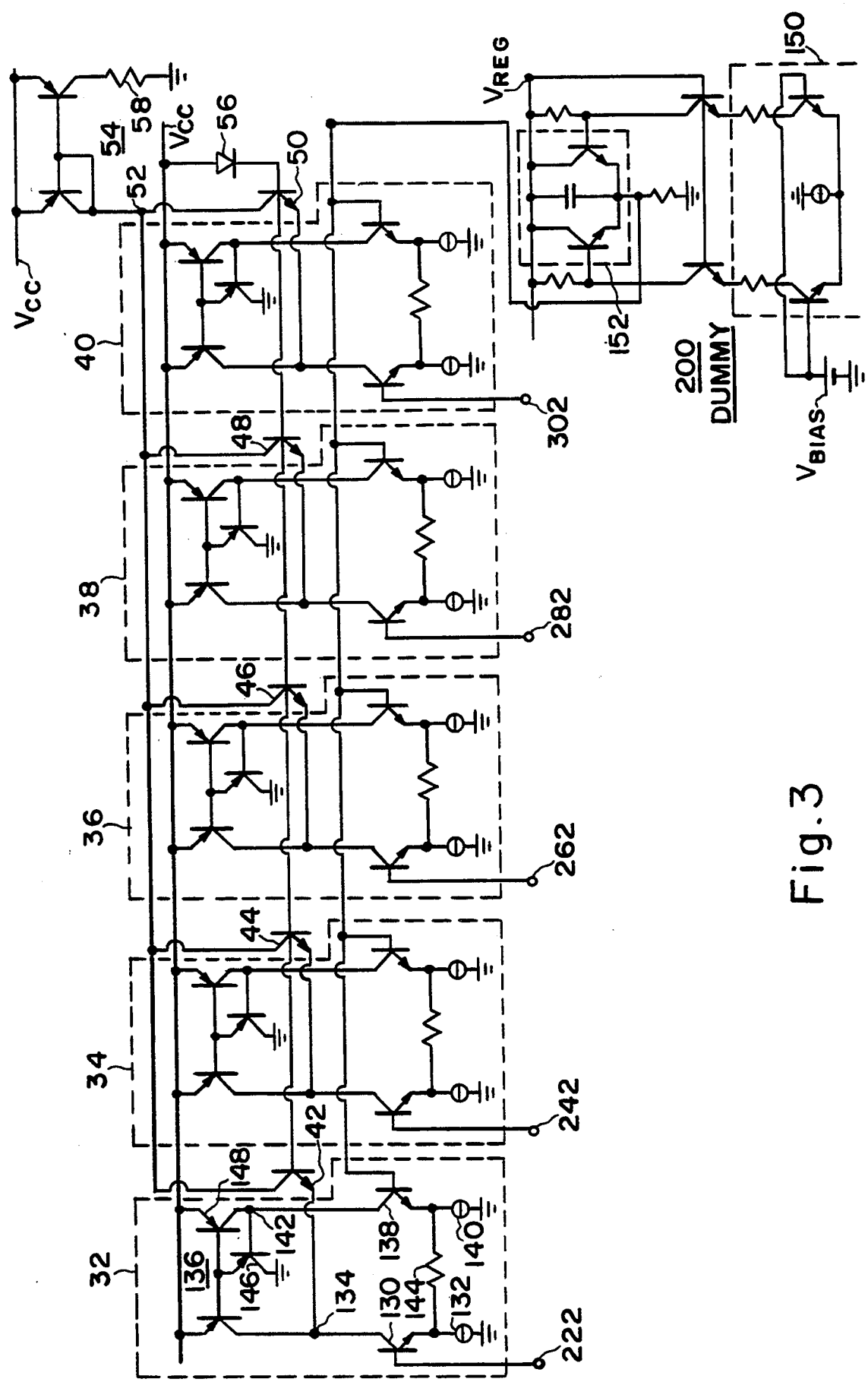
FIG. 3 gives the voltage-to-current conversion and current summing part at the transistor level.

FIG. 3 gives an example of the transistor-level circuit diagram for converters 32–40 and summing part 42–56 of the detector in the invention. Only converter 32 is discussed in detail below since converters 32–40 are substantially identical in arrangement and operation.

Converter 32 comprises a differential amplifier with an NPN transistor 130 that has its main current path arranged between a current source 132 and an output 134 of a current mirror 136, and with an NPN transistor 138 similarly located between a current source 140 and an input 142 of current mirror 136. A control electrode of transistor 130 is connected to rectifier output 222 for receiving the rectified signal from rectifier 22. A control electrode of transistor 138 receives a control voltage from a dummy stage 200 that is described below. A resistor 144 connects a node between transistor 130 and current source 132 to a node between transistor 138 and current source 140. Transfer transistor 42 has a main current path connected between output 134 of current mirror 136 and input 52 of current mirror 54.

The voltage difference between the control electrodes of transistors 130 and 138 generates approximately the same voltage difference across resistor 144. The value of resistor 144 thereupon determines the value of the current through resistor 144 and thus controls the scaling of the signal. Since the currents supplied by current mirror 136 to transistors 130 and 138 are identical, this current has to be furnished via transfer transistor 42 by current mirror 54. All other converters 34–40 are connected to current mirror 54 through the corresponding transfer transistors 44–50. As a result, the currents in all converters 32–40 are summed in current mirror 54. The output of current mirror 54 provides this aggregated current to RSSI resistor 58.

The rescaling of the signals in order to compensate for losses in, for instance, interstage filter 62 is accomplished by means of resistor 144 and the corresponding resistors in converters 34–40. For trimming and adjustment purposes, these rescaling resistors can be made adjustable by, for instance, providing them as replaceable discrete devices. Resistor 144 and the corresponding resistors in converters 34–40 have values in the typical range of 29–58 kohms and are adjusted to minimize the deviation from the straight line output characteristic that represents the linear function of the logarithm of the input signal. Note that changing the values of resistor 144 and of the corresponding resistors in converters 34–40 does not require that other parts of the circuit be adapted to the change, as distinct from the prior art device.

Transfer transistors 42–50 have their control electrodes connected to one another and via diode 56 to voltage supply $V_{cc}$. The voltage at node 134 therefore lies substantially two voltage drops of, in this example, $V_{BE}$ below $V_{cc}$. Owing to the voltage drops in PNP transistors 146 and 148 of current mirror 136, the voltage at node 142 is kept at substantially $2V_{BE}$ below $V_{cc}$ as well. This balances the individual differential amplifiers in the converters and substantially removes the quiescent (dc) currents from the signals supplied to current mirror 54.

Instead of using current sources 132 and 140 and resistor 144, a single current source may be used that is coupled to the main current paths of transistors 130 and 138 through first and second resistors, respectively (not shown). Again the values of these first and second resistors determine the scaling of the signal upon rectification.

As stated above, transistor 138 and the corresponding transistors in converters 34–40 receive a common control voltage. Preferably, this control voltage is derived from dummy stage 200 that includes a differential amplifier 150 connected to a dummy rectifier 152, identical to amplifier 12 and rectifier 22, respectively. Amplifier 150 is controlled, not by the input signal, but by a bias voltage $V_{BIAS}$ that represents a dc component of the input signal.

As is clear from the drawing, the number of stages, each including an amplifier (12–20), a rectifier (22–30), a rescaling and voltage-to-current conversion device (42–50) and a transfer transistor (42–50), that can be arranged in a circuit in accordance with the invention is not limited. In the prior art, however, the available power supply restricts the number of stages as a consequence of the number of resistors to be stacked in a ladder.

CURRENT SOURCE

Current source 84 (FIG. 2) and the corresponding current sources in amplifiers 14–20 need some special attention. It can be derived that the gain of amplifier 12 is proportional to the value of resistor 100 and to the value of the current supplied by source 84, and is inversely proportional to temperature. Likewise, it can be derived that the output voltage across RSSI resistor 58 is proportional to the value of resistor 96, to the value of the current supplied by source 84 and to the value of RSSI resistor 58 (FIG. 3), and is inversely proportional to the value of resistor 144 (FIG. 3).

If current source 84 furnishes a temperature-independent current, the gain of amplifier 12 is inversely proportional to temperature, whereas the output voltage across RSSI resistor 58 has a fixed-slope characteristic that shifts with temperature. Although some variation in the gain is tolerable since the amplifiers are used as limiters, temperature shift in the output voltage is unacceptable.

If current source 84 provides a current proportional to temperature, the gain is stable with regard to temperature. However, the output voltage across RSSI resistor 58 is proportional to temperature.

Figure 4:
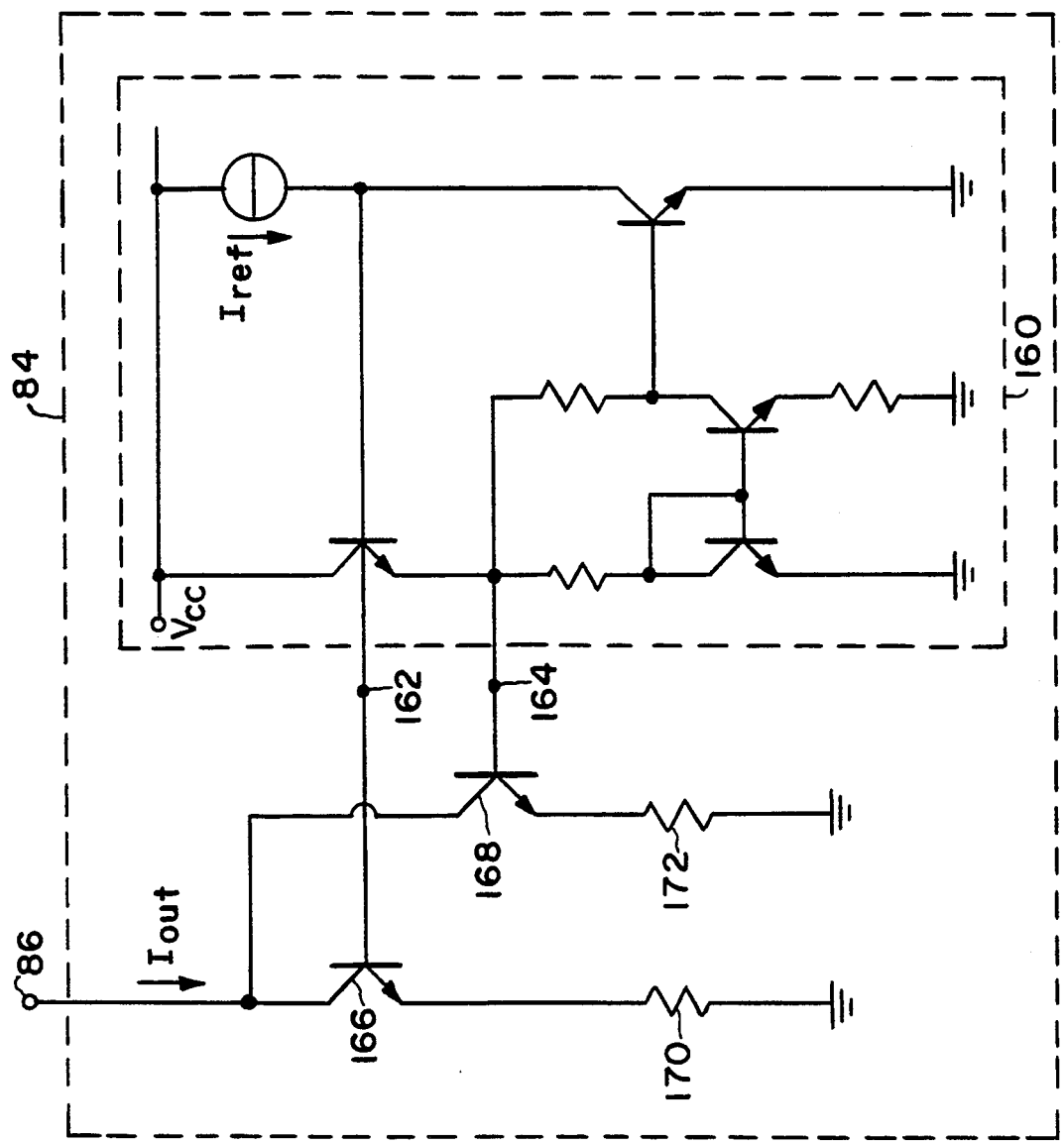
FIG. 4 represents a current source for temperature compensation of the circuit.

FIG. 4 is an example of current source 84 that is a good compromise between the above two extremes. Current source 84 here includes a band-gap-referenced biasing circuit, e.g., a Widlar band-gap circuit 160. For details on Widlar band-gap circuit 160 in particular and band-gap-referenced biasing circuits in general, see P. Gray and R. Meyer, *Analysis and Design of Analog Integrated Circuits*, Second Edition, 1984, pp. 289–296. Circuit 160 has output nodes 162 and 164 connected to control electrodes of NPN transistors 166 and 168, respectively. Main current paths of transistors 166 and 168 are connected in series with resistors 170 and 172, respectively, between node 86 and ground. Current source 84 therefore provides at node 86 an output current $I_{out}$ that is the sum of currents conducted by transistors 166 and 168.

Transistor 166 conducts a constant current that is inversely proportional to the value of resistor 170. Transistor 168 conducts a current that is proportional to temperature and inversely proportional to the value of resistor 172. By adjusting the values of resistors 170 and 172 the temperature stability can be regulated. Computer simulations were used to optimize the linear combination of the temperature-independent current and the other current that varies proportionally to temperature, in order to provide a good solution as regards temperature-compensated performance of the overall circuit for the temperature range of interest (−55° C. to 125° C.). Owing to the modular architecture of the logarithmic detector, the current sources in amplifiers 14-20 are identical to source 84.

Preferably, RSSI resistor 58 is an integrated shallow P-type (SP) resistor, whose value is only marginally dependent on temperature. Resistors 96 and 144 preferably have identical temperature behavior. With the suitable combination of resistors 170 and 172 the RSSI performance then is substantially temperature-independent. Typically, resistor 170 is 300 K, resistor 172 is 30 K and resistor 58 is 80 K.

The above described logarithmic detector preferably is integrated in a monolithic integrated circuit device. Although the drawing shows bipolar transistors, field effect transistors can be used as well.

We claim:

1. An electronic circuit with a logarithmic detector, comprising:
   i) amplifying means responsive to an input voltage for amplifying the input voltage to produce a series of amplified versions of the input voltage;
   ii) isolated rectifying means for rectifying the amplified versions to produce rectified versions, said isolated rectifying means being isolated from the amplifying means such that the isolated rectifying means is not loaded by the amplifying means;
   iii) rescaling and conversion means coupled to the isolated rectifying means for rescaling and converting the rectified versions into currents; and
   iv) current summing means coupled to the rescaling and conversion means for summing the currents to produce an aggregated current at an output.

2. A circuit as in claim 1, wherein:
   i) the amplifying means comprises a cascade of a plurality of voltage amplifiers, each voltage amplifier of the plurality of voltage amplifiers having inputs and outputs for generating a respective one of the amplified versions of the input voltage.

3. A circuit as in claim 2, wherein the isolated rectifying means comprises a like plurality of rectifying elements, each of the rectifying elements comprising rectifier input nodes indirectly coupled to the outputs of said respective one of the voltage amplifiers for receiving the respective one of the amplified versions and a rectifier output node for providing a respective one of the rectified versions.

4. A circuit as in claim 3, wherein said each voltage amplifier includes a differential transistor pair, each transistor of the transistor pair has a main current path coupled to an amplifier power supply through a respective series arrangement of first and second resistors, a buffer transistor and an intermediate node, each intermediate node being connected to a respective one of the rectifier input nodes, and the buffer transistors being switchable for said rectifying means.

5. A circuit as in claim 4 wherein the main current paths of the transistors are connected to one another and to a current source that includes a first current conducting device for supplying a first current substantially independent of temperature and a second current conducting device that furnishes a second current substantially proportional to temperature.

6. A circuit as in claim 4, wherein in said each voltage amplifier the first resistor is connected to the amplifier power supply, and a main current path of the respective buffer transistor receives also the amplifier power supply at a control electrode and is located between the intermediate node and the second resistor.

7. A circuit as in claim 6, comprising a power supply separate from said amplifier power supply for supplying power to the rescaling and conversion means and the summing means for reducing propagation of supply line voltage fluctuations occurring in said amplifier power supply due to switching in the amplifier means.

8. A circuit as in claim 3, wherein said each of the rectifying elements includes a parallel arrangement of a capacitor and of main current paths of first and second transistors between an amplifier power supply and the rectifier output node, control electrodes of the first and second transistors being connected to the rectifier input nodes.

9. A circuit as in claim 8, wherein a discharge path connected between the rectifier output node and the amplifier power supply comprises at least a resistor, a diode or a main current path of a transistor having a control electrode that receives a discharge control voltage at the control electrode.

10. A circuit as in claim 9, Wherein the discharge path is a low current discharge path including on-chip filtering capacitors such that the circuit is an integrated device.

11. A circuit as in claim 2 wherein the rescaling and conversion means includes a like plurality of rescaling and converting devices.

12. A circuit as in claim 11, wherein each rescaling and converting device comprises a differential transistor pair with first and second transistors, the first transistor having a main current path coupled between an output of a first current mirror and a first node and having a control electrode coupled to the respective output node of the isolated rectifying means, the second transistor having a main current path connected between an input of the first current mirror and a second node and having a control electrode coupled to a reference voltage supply, the first and second nodes being interconnected through a resistor, and wherein the current summing means includes a second current mirror whose input receives the output of each first current mirror and whose output is connected to a further resistor.

13. A circuit as in claim 12 wherein the output of said each first current mirror is coupled to the input of the second current mirror through a main current path of a respective transfer transistor that has its control electrode coupled to a power supply through at least a diode or a resistor.

14. A circuit as in claim 12 wherein the first and second transistors are of a bipolar type.

15. A circuit as in claim 12, wherein the isolated rectifying means include a like plurality of rectifying elements, each having rectifier input nodes and a rectifier output node; wherein the reference voltage supply includes a dummy amplifier that receives a bias voltage at its amplifier input and is at least substantially identical to each of the amplifiers in the cascade, and a dummy rectifying element that is at least substantially identical to each of the rectifying elements and that is connected to the dummy amplifier, the dummy rectifying element supplies a reference voltage.

16. A circuit as in claim 2, wherein the isolated rectifying means is a full wave rectifier.

17. A circuit as in claim 1 in an integrated device.